United States Patent
Daigle et al.

(10) Patent No.: US 12,140,646 B2
(45) Date of Patent: Nov. 12, 2024

(54) MAGNETIC SENSING HAVING HALL PLATE ROUTING TO REDUCE INDUCTIVE COUPLING

(71) Applicant: Allegro MicroSystems, LLC, Manchester, NH (US)

(72) Inventors: Tyler Daigle, Scarborough, ME (US); Srujan Shivanakere, Nashua, NH (US); Maxwell McNally, Manchester, NH (US); Alec Smith, Merrimack, NH (US); Steven Daubert, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 125 days.

(21) Appl. No.: 18/164,676

(22) Filed: Feb. 6, 2023

(65) Prior Publication Data
US 2024/0264248 A1    Aug. 8, 2024

(51) Int. Cl.
*G01R 33/07*          (2006.01)
*H10N 52/01*          (2023.01)

(52) U.S. Cl.
CPC ............. *G01R 33/07* (2013.01); *H10N 52/01* (2023.02)

(58) Field of Classification Search
None
See application file for complete search history.

(56) References Cited

U.S. PATENT DOCUMENTS

| | | |
|---|---|---|
| 5,781,005 A | 7/1998 | Vig et al. |
| 5,917,320 A | 6/1999 | Scheller et al. |
| 5,923,162 A | 7/1999 | Drafts et al. |
| 6,091,239 A | 7/2000 | Vig et al. |
| 6,278,269 B1 | 8/2001 | Vig et al. |
| 6,525,531 B2 | 2/2003 | Forrest et al. |
| 6,693,419 B2 | 2/2004 | Stauth et al. |
| 7,026,808 B2 | 4/2006 | Vig et al. |

(Continued)

FOREIGN PATENT DOCUMENTS

| | | |
|---|---|---|
| WO | WO 2005/073744 A1 | 8/2005 |
| WO | WO 2018/217356 A2 | 11/2018 |

OTHER PUBLICATIONS

Bilotti et al., "Monolithic Magnetic Hall Sensor Using Dynamic Quadrature Offset Cancellation;" Product Description, Allegro MicroSystems, Inc.; Technical Paper STP 97-10; 8 Pages.

Jiang et al., "Multipath Wide-Bandwidth CMOS Magnetic Sensors;" IEEE Journal of Solid-State Circuits, vol. 52, No. 1; Jan. 2017; 12 Pages.

Mohan et al., "Simple Accurate Expressions for Planar Spiral Inductances;" IEEE Journal of Solid-State Circuits, vol. 34, No. 10; Oct. 1999; 6 Pages.

(Continued)

*Primary Examiner* — Jas A Sanghera
(74) *Attorney, Agent, or Firm* — DALY, CROWLEY, MOFFORD & DURKEE, LLP (57) ABSTRACT

Methods and apparatus for canceling inductive coupling in a magnetic field sensing device having one or more Hall elements. A device can include a Hall element having a first pair of first and second voltage sensing terminals at diametrically opposed locations on the Hall element, and a second pair of third and fourth voltage sensing terminals diametrically opposed locations on the Hall element. A first mirror conductive path extends around a perimeter of the Hall element in a first direction a second mirror conductive path extends around the perimeter of the Hall element in a second direction so that the first and second mirror conductive paths are on opposite sides of the Hall element and are equal and opposite to cancel inductive coupling.

32 Claims, 7 Drawing Sheets

(56) References Cited

U.S. PATENT DOCUMENTS

| | | |
|---|---|---|
| 7,253,614 B2 | 8/2007 | Forrest et al. |
| 7,368,904 B2 | 5/2008 | Scheller et al. |
| 7,425,821 B2 | 9/2008 | Monreal et al. |
| 7,605,647 B1 | 10/2009 | Romero et al. |
| 7,772,838 B2 | 8/2010 | Bailey et al. |
| 7,777,607 B2 | 8/2010 | Taylor et al. |
| 8,450,996 B2 | 5/2013 | Foletto et al. |
| 8,624,588 B2 | 1/2014 | Vig et al. |
| 8,729,892 B2 | 5/2014 | Friedrich |
| 8,736,003 B2 | 5/2014 | Erie et al. |
| 10,197,602 B1 | 2/2019 | Nehmeh |
| 10,234,516 B2 | 3/2019 | Haas et al. |
| 11,163,019 B1 | 11/2021 | Chaware et al. |
| 11,307,267 B1 | 4/2022 | Polley et al. |
| 11,366,141 B1 | 6/2022 | Daubert et al. |
| 11,402,440 B2 | 8/2022 | Chaware et al. |
| 2005/0230769 A1 | 10/2005 | Lilian et al. |
| 2007/0029999 A1 | 2/2007 | Middelhoek et al. |
| 2007/0247141 A1 | 10/2007 | Pastre et al. |
| 2007/0291112 A1 | 12/2007 | Harris |
| 2012/0016614 A1* | 1/2012 | Hohe .................. G01R 33/075 324/202 |
| 2012/0119734 A1 | 5/2012 | Han |
| 2012/0249126 A1 | 10/2012 | Friedrich et al. |
| 2013/0179115 A1 | 7/2013 | Friedrich et al. |
| 2013/0214774 A1 | 8/2013 | Cesaretti et al. |
| 2014/0132257 A1 | 5/2014 | Sugano et al. |
| 2014/0210458 A1 | 7/2014 | Ausserlechner |
| 2016/0282425 A1 | 9/2016 | Haas et al. |
| 2021/0325480 A1 | 10/2021 | Ronis et al. |

OTHER PUBLICATIONS

Steiner et al., "Influence of Mechanical Stress on the Offset Voltage of Hall Devices Operated with Spinning Current Method;" Journal of Microelectromechanical Systems, vol. 8, No. 4; Dec. 1999; 7 Pages.

Li et al., "A Fast T&H Overcurrent Detector for a Spinning Hall Current Sensor with Ping-Pong and Chopping Techniques;" Proceedings of IEEE Journal of Solid-State Circuits, vol. 54, No. 7; Jul. 2019; 10 Pages.

PCT International Search Report and Written Opinion of the ISA dated Mar. 13, 2024 for International Application No. PCT/US2023/078426; 19 Pages.

Kammerer et al., "A Hall Effect Sensors Network Insensitive to Mechanical Stress;" Sensors, 2004; Proceedings of the IEEE; Oct. 24-27, 2004; 4 Pages.

Motz et al., "A Chopped Hall Sensor With Small Jitter and Programmable "True Power-On" Function;" Proceedings of the IEEE Journal of Solid-State Circuits, vol. 40, No. 7; Jul. 2005; 8 Pages.

Randjelovic et al., "Highly Sensitive Hall Magnetic Sensor Microsystem in CMOS Technology;" Proceedings of the IEEE Journal of Solid-State Circuits, vol. 37, No. 2; Feb. 2002; 9 Pages.

Steiner et al., "Double-Hall Sensor with Self-Compensated Offset;" Proceedings of the IEEE—International Electron Devices Meeting (IEDM); Dec. 10, 1997; 4 Pages.

van der Meer et al., "CMOS Quad Spinning-Current Hall-Sensor System for Compass Application;" Sensors, 2004; Proceedings of the IEEE; Oct. 24-27, 2004; 4 Pages.

* cited by examiner

MAGNETIC SENSING HAVING HALL PLATE ROUTING TO REDUCE INDUCTIVE COUPLING

BACKGROUND

As is known, there is a variety of types of magnetic field sensing elements, including, but not limited to, Hall effect elements, magnetoresistance elements, and magnetotransistors. As is also known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Magnetic field sensors, i.e., circuits that use magnetic field sensing elements, are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

Magnetic field sensors that include Hall elements have signal routing from a Hall plate to a Hall voltage amplifier that may have undesired inductive coupling from a time varying magnetic field source. Any loops in this routing will transduce magnetic signals to a voltage which is in addition to the Hall effect voltage, which is the signal of interest. As is known in the art, this effect is difficult to model. In addition, this inductive coupling effect can alter signal path frequency response. Hall effect sensors commonly use offset and/or flicker noise reduction techniques such as chopping or auto-zeroing. These techniques employ a high frequency clock to sample the input signal. Since the inductive coupling increases with frequency, the resulting sampling may alias high frequency signals to lower frequencies. These low frequency signals are unwanted and are difficult to remove.

SUMMARY

Embodiments of the disclosure provide methods and apparatus for magnetic sensors having Hall elements with routing to reduce the effects of inductive coupling from the Hall plate to an amplifier, for example. In embodiments, routing can be configured to have equal and opposite circuit loops that have a net zero effect on inductive signal coupling. Example sensor embodiments can include an individual Hall plate. In other sensor embodiments, net zero loops are formed for multiple Hall plates.

In some embodiments, to reduce the effects of inductive coupling, routing from the Hall plate to the subsequent amplifier can be configured such that net total inductive coupling is balanced by mirrored Hall plate instances and/or chop phases. In embodiments, each Hall plate completes one loop per chop or auto-zero phase. Equal and opposite loops may be completed through mirrored Hall plate instances. Equal and opposite loops may be completed through each separate chop phase. Signal routing from the Hall voltage sense terminals to the front-end amplifier are routed relatively close to each other when traversing long distances (e.g., from one side of the Hall plate array to the other) to avoid creating additional loops.

In one aspect, a device comprises: a Hall element having a first pair of first and second voltage sensing terminals, wherein the first and second voltage sensing terminals are located at diametrically opposed locations on the Hall element, and a second pair of third and fourth voltage sensing terminals, wherein the third and fourth voltage sensing terminals are located at diametrically opposed locations on the Hall element; and a first mirror conductive path extending around a perimeter of the Hall element in a first direction to the first voltage sensing terminal in the first pair of voltage sensing terminals and a second mirror conductive path extending around the perimeter of the Hall element in a second direction to the first voltage sensing terminal so that the first and second mirror conductive paths are on opposite sides of the Hall element and are equal and opposite to cancel inductive coupling.

A device can further include one or more of the following features: an array of Hall elements having routing to cancel inductive coupling, an array of Hall elements having routing to cancel inductive coupling during a first phase comprising first voltage sensing locations on the respective Hall elements and a second phase comprising second voltage sensing locations on the Hall elements shifted from the first phase sensing locations, first and second phases form part a signal chopping process, the first and second voltage sensing locations are shifted ninety degrees from the first phase to the second phase, the array of Hall elements comprises four Hall elements, two of the Hall elements are configured to cancel inductive effects of the other two Hall elements, and/or at least one twisted wire pair comprising a first wire connected to at least one of the positive voltage sensing terminals and a second wire connected to at least one of the negative voltage sensing terminals.

In another aspect, a method comprises: in a magnetic field sensing device, employing a Hall element having a first pair of first and second voltage sensing terminals, wherein the first and second voltage sensing terminals are located at diametrically opposed locations on the Hall element, and a second pair of third and fourth voltage sensing terminals, wherein the third and fourth voltage sensing terminals are located at diametrically opposed locations on the Hall element; and employing a first mirror conductive path extending around a perimeter of the Hall element in a first direction to the first voltage sensing terminal in the first pair of voltage sensing terminals and a second mirror conductive path extending around the perimeter of the Hall element in a second direction to the first voltage sensing terminal so that the first and second mirror conductive paths are on opposite sides of the Hall element and are equal and opposite to cancel inductive coupling.

A method can further include one or more of the following features: employing an array of Hall elements having routing to cancel inductive coupling, employing an array of Hall elements having routing to cancel inductive coupling during a first phase comprising first voltage sensing locations on the respective Hall elements and a second phase comprising second voltage sensing locations on the Hall elements shifted from the first phase sensing locations, first and second phases form part a signal chopping process, the first and second voltage sensing locations are shifted ninety degrees from the first phase to the second phase, the array of Hall elements comprises four Hall elements, two of the Hall elements are configured to cancel inductive effects of the other two Hall elements, and/or employing at least one twisted wire pair comprising a first wire connected to at least one of the positive voltage sensing terminals and a second wire connected to at least one of the negative voltage sensing terminals.

In a further aspect, a device comprises: an array of Hall elements each of the Hall elements having a first pair of first and second voltage sensing terminals, wherein the first and second voltage sensing terminals are located at diametrically opposed locations on the Hall elements, and a second pair of third and fourth voltage sensing terminals, wherein the third and fourth voltage sensing terminals are located at diametrically opposed locations on each of the Hall elements; and routing connections comprising a first path from the first voltage sensing terminal of first and second ones of the Hall elements and a second path from the second voltage sensing terminals of the first and second ones of the Hall elements, wherein the first and second paths are configured to mutually cancel fields generated in the first and second ones of the Hall elements.

A device can further include one or more of the following features: the array of Hall elements comprises four Hall elements, the first and second paths are connected during a first phase and not connected during a second phase, the routing connections further comprise, during the second phase, a third path from the third voltage sensing terminal of first and second ones of the Hall elements and a fourth path from the second voltage sensing terminals of the first and second ones of the Hall elements, wherein the third and fourth paths are configured to mutually cancel fields generated in the first and second ones of the Hall elements, a first connection comprising at least one twisted wire pair comprising a first wire connected to at least one of the positive voltage sensing terminals and a second wire connected to at least one of the negative voltage sensing terminals, the first connection is present during a first phase of a chopping process, a second connection comprising at least one twisted wire pair comprising a third wire connected to at least one of the positive voltage sensing terminals and a fourth wire connected to at least one of the negative voltage sensing terminals, and/or the second connection is present during a second phase of the chopping process.

In a further aspect, a method comprises: in a magnetic field sensing device, employing an array of Hall elements each of the Hall elements having a first pair of first and second voltage sensing terminals, wherein the first and second voltage sensing terminals are located at diametrically opposed locations on the Hall elements, and a second pair of third and fourth voltage sensing terminals, wherein the third and fourth voltage sensing terminals are located at diametrically opposed locations on each of the Hall elements; and employing routing connections comprising a first path from the first voltage sensing terminal of first and second ones of the Hall elements and a second path from the second voltage sensing terminals of the first and second ones of the Hall elements, wherein the first and second paths are configured to mutually cancel fields generated in the first and second ones of the Hall elements.

A method can further include one or more of the following features: the array of Hall elements comprises four Hall elements, the first and second paths are connected during a first phase and not connected during a second phase, the routing connections further comprise, during the second phase, a third path from the third voltage sensing terminal of first and second ones of the Hall elements and a fourth path from the second voltage sensing terminals of the first and second ones of the Hall elements, wherein the third and fourth paths are configured to mutually cancel fields generated in the first and second ones of the Hall elements, a first connection comprising at least one twisted wire pair comprising a first wire connected to at least one of the positive voltage sensing terminals and a second wire connected to at least one of the negative voltage sensing terminals, the first connection is present during a first phase of a chopping process, a second connection comprising at least one twisted wire pair comprising a third wire connected to at least one of the positive voltage sensing terminals and a fourth wire connected to at least one of the negative voltage sensing terminals, and/or the second connection is present during a second phase of the chopping process.

BRIEF DESCRIPTION OF THE DRAWINGS

The foregoing features of this invention, as well as the invention itself, may be more fully understood from the following description of the drawings in which.

DETAILED DESCRIPTION

Figure 1:
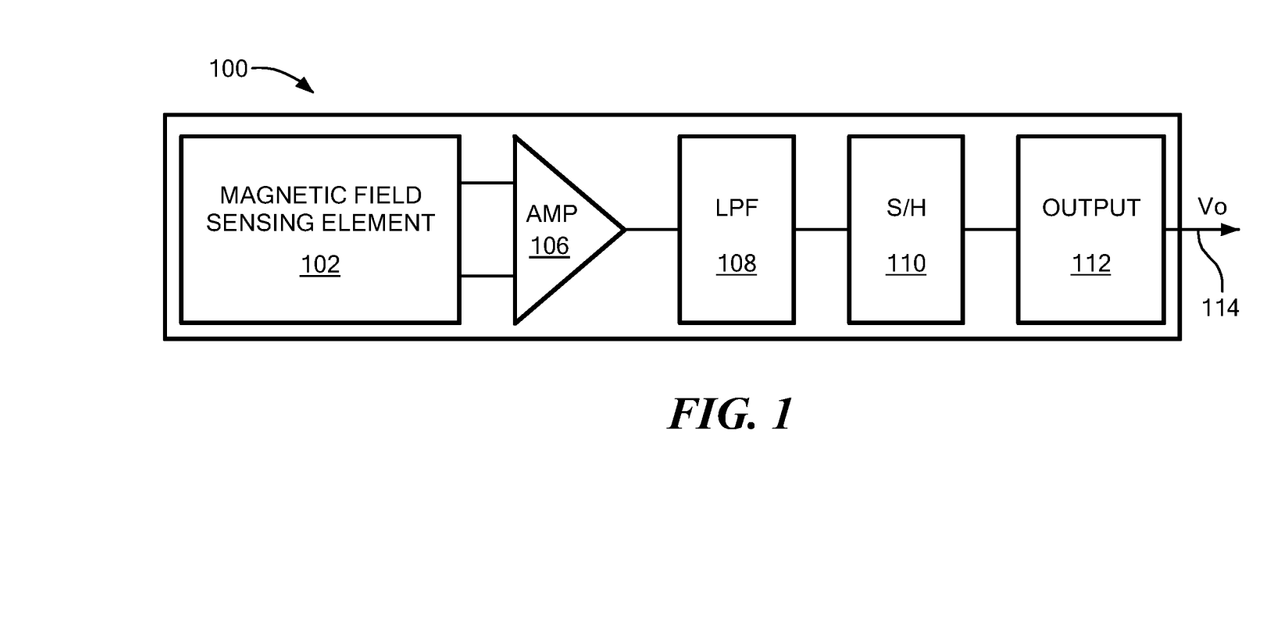
FIG. 1 is a block diagram of a sensor having at least one Hall element with routing configured to reduce inductive coupling.

FIG. 1 shows an example magnetic field sensor system 100 having Hall element routing configured to reduce the effects of inductive coupling for routing from the Hall plate to another circuit component, such as an amplifier, in accordance with example embodiments of the invention. In the illustrated embodiment, the sensor system 100 is configured to detect motion characteristics of a target by sensing a change in magnetic field. The sensor system 100, which can be provided in an integrated circuit (IC) package, includes a magnetic field sensing element 102, which is provided as a Hall element in the illustrated embodiment. The magnetic field sensing element 102 is coupled to an amplifier 106 and filtered, such as by a low pass filter (LPF) 108, and then provided to a sample and hold module 110. The output of the sample and hold module 110 is connected to an output module 112 which outputs a sensor output signal 114.

Note that chopping of the signal occurs between the sensing element 102 and the amplifier 106, e.g., before the lowpass filter 108. Thus any high frequency signal that is inductively coupled at the Hall element will be aliased by the chopping process.

As is readily appreciated by one skilled in the art, when laying out a Hall plate for operation at high frequencies, e.g., sense signals in the order of hundreds of kHz, inductive coupling can occur. As Hall plates increase in size, e.g., >50 µm per side, routing from the Hall voltage sense terminals to the front-end amplifier can create a loop that is completed through the Hall plate. When a magnetic field passes through a loop, electrical current is generated. In addition, sense signal chopping, auto-zero phase processing and the like, can worsen the effects of inductive coupling by aliasing high frequency signals that would normally be out of the band of interest into the desired signal frequency band.

Figure 2:
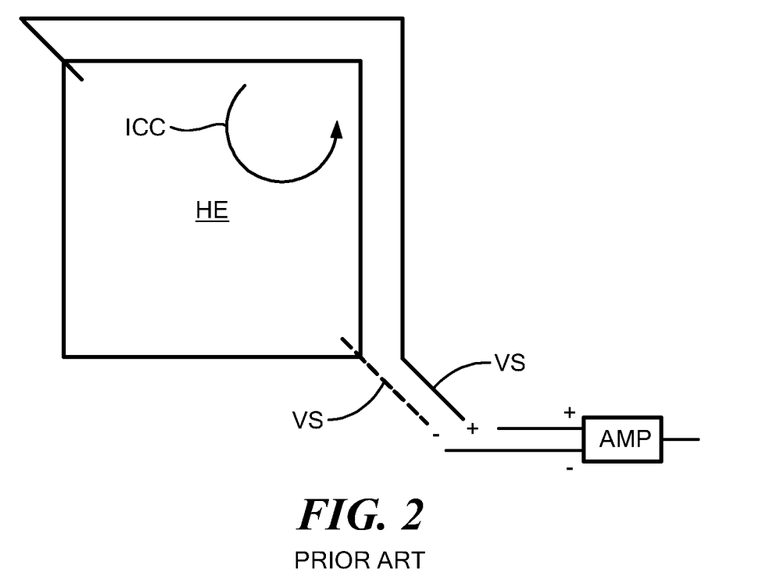
FIG. 2 is a layout representation of a portion of a sensor having a Hall element with prior art routing subject to inductive coupling.

FIG. 2 shows typical prior art routing from a Hall element HE with voltage sense terminals VS+, VS-connected to an amplifier AMP. The Hall voltage sense terminals VS+, VS– are coupled to the positive and negative inputs of a front-end amplifier. The curved line ICC with the arrow represents the direction of the inductively coupled current. A magnetic field going into (or out of) the page creates a current flowing from the negative terminal VS– to the positive terminal VS+ (or from the positive terminal VS+ to the negative terminal VS–), which sums with the desired Hall voltage. The inductive coupling increases with frequency, such as about +6 dB per octave, which can adversely affect frequency response flatness.

In addition, if a dynamic offset reduction technique that require multiple biasing phases is used (such as chopping, spinning, auto-zero, etc.), inductive coupling may generate unwanted aliasing of high frequency signals to a lower frequency. With these offset reduction techniques, the Hall effect signal is expected to reverse polarity from one phase to the other. On the other hand, the inductive coupled signal will not have the same polarity reversal.

Figure 3:
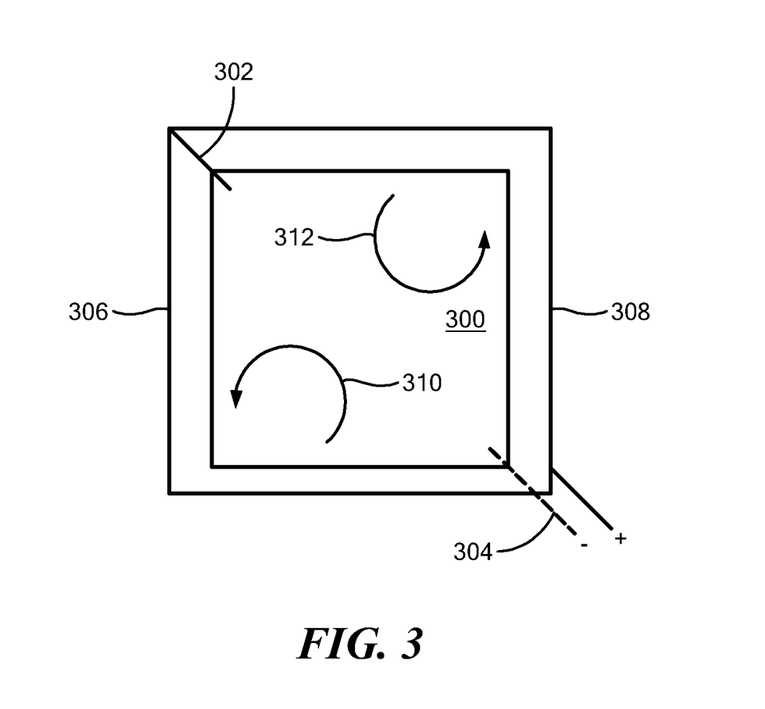
FIG. 3 is a layout representation of a portion of a sensor having at least one Hall element with a routing configuration configured to reduce inductive coupling.

FIG. 3 shows an example of routing for a Hall plate 300 that includes first (positive) and second (negative) voltage sense terminals 302, 304. In the illustrated embodiment, the first voltage sense terminal 302 is located diametrically across the Hall element 300 from the second voltage sense terminal 304. In embodiments, first and second mirror loops 306,308 are formed around the Hall element 300 that are equal and opposite to make connections to the first voltage sense terminal 302. In the illustrated configuration, the second mirror loop 308 is equal in area with the first mirror loop 306, but with current flow in the opposite direction. First and second currents 310, 312, which are opposite to each other, and thus cancel each other, are formed by field in to (or out of) the page in both the first and second mirror loops 306, 308. The first and second mirror loops 306, 308 are formed by routing the first (positive (+)) voltage sense terminal 302 around the entire Hall plate 300 to eliminate current flow from negative (−) to positive (+) terminals. It is understood that 310 and 312 represent current flow as a result of field going in to or out of the page, not magnetic field itself. The field in to (or out of) the page generates the current flow.

Figure 4A:
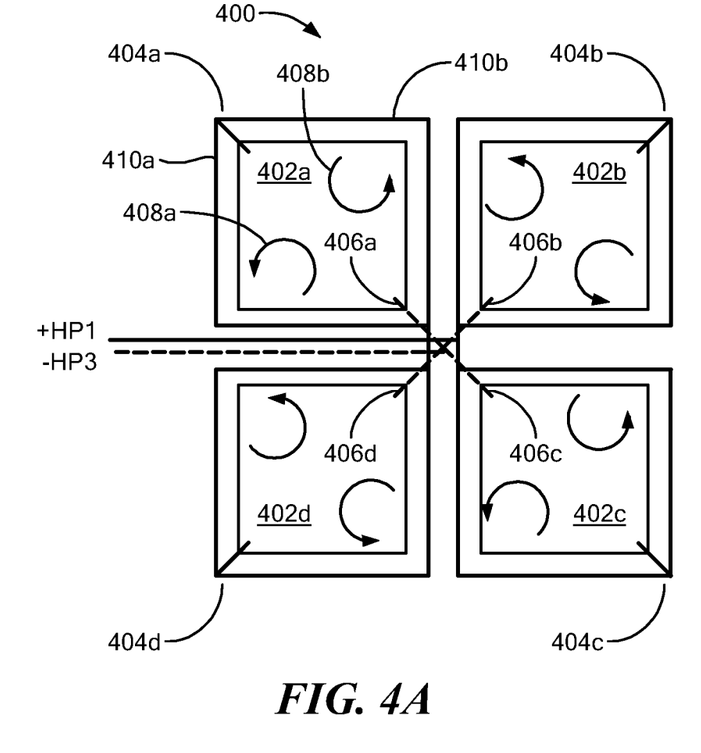
FIG. 4A shows phase 1 and FIG. 4B shows phase 2 configurations for a quad Hall element array with a routing configuration configured to reduce inductive coupling.
Figure 4B:
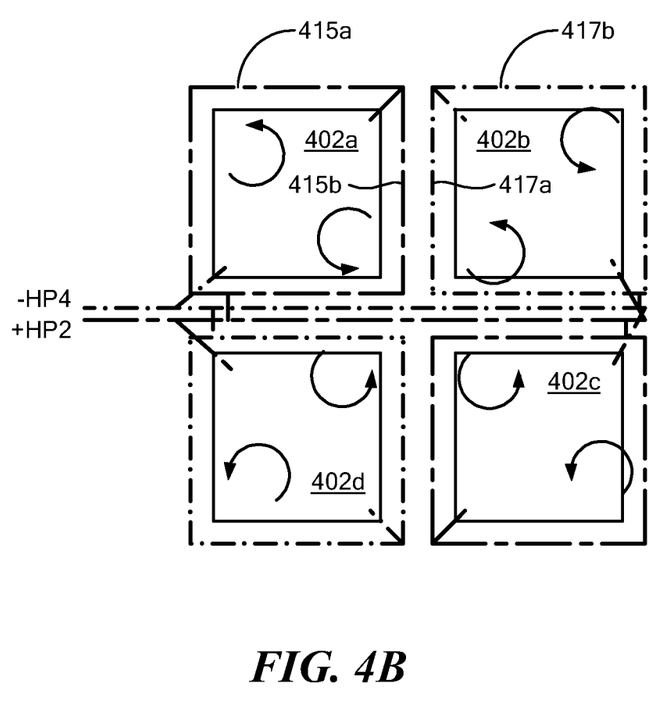

FIGS. 4A and 4B show an example embodiment 400 of inductive coupling cancellation in a sensor having multiple Hall elements 402a,b,c,d. FIG. 4A shows connections during phase 1 of a signal chopping procedure and FIG. 4B shows connection during phase 2 of the chopping procedure. Multiple Hall 402 plates may be used to reduce thermal noise and offset by sensing voltages over multiple Hall elements at the same time.

In the illustrated embodiment, a quad array 402a-d of Hall elements can be used to facilitate signal chopping. As can be seen, the position of Hall voltage sense terminals across the Hall elements changes from corner to corner for different phases. For example, in a first signal chopping phase (phase 1), a positive voltage sense terminal is in the outer corners 404a,b,c,d of the quad array, i.e., upper left corner 404a of the upper left Hall plate 402a, upper right corner 404b of the upper right Hall plate 402b, lower right corner 404c of the lower right Hall plate 402c, and lower left corner 404d of the lower left Hall element 402d. These Phase 1 connections are labeled +HP1. During phase 1, the negative Hall voltage sense terminals 406a-d are diagonally across from the positive Hall voltage sense terminals. The negative Hall voltage sense terminals 406a-d for phase 1 are labeled –HP3.

In a manner similar that described above for FIG. 3, each connection across the respective Hall elements comprises equal and opposite mirror loops. For example, during Phase 1, a connection to the positive voltage sense terminal of the first Hall element 402a located at top left corner 404a of the quad array comprises equal and opposite mirror loops 410a,b to cancel currents 408a,b resulting from field in the mirror loops. Similarly, each connection to the positive voltage sense terminal of the other three Hall elements 402b,c,d has mirror loops to cancel respective current generated by fields in each of Hall elements during the first chopping phase.

During phase 2 shown in FIG. 4B, the connections of the Hall voltage sense terminals move to the other corners of the Hall elements and are shown as +HP2 and –HP4. As can be seen, the voltage sense terminals rotate 90 degrees to the opposite corners of the Hall elements, as in phase 1. It should be noted that while in Phase 1, the mirror loops are only for +HP1 connections, in Phase 2, two of the –HP4 connections are mirror loops and two of the +HP2 connections are mirror loops. For example, the upper left Hall element 402a has mirror loops 415a,b for a positive voltage sense terminal +HP2 and the upper right Hall element 402b has mirror loops 417a,b for a negative voltage sense terminal –HP4. The mirror loops cancel the currents generated by fields for a net zero inductive coupling in each Hall element 402a-d.

It is understood that the words "upper," "lower," "left," "right," and other such relative terms are intended to facilitate a description and understanding of example embodiments of the disclosure. Such terms are not intended to limit the scope of the invention as claimed in any way.

Figure 5A:
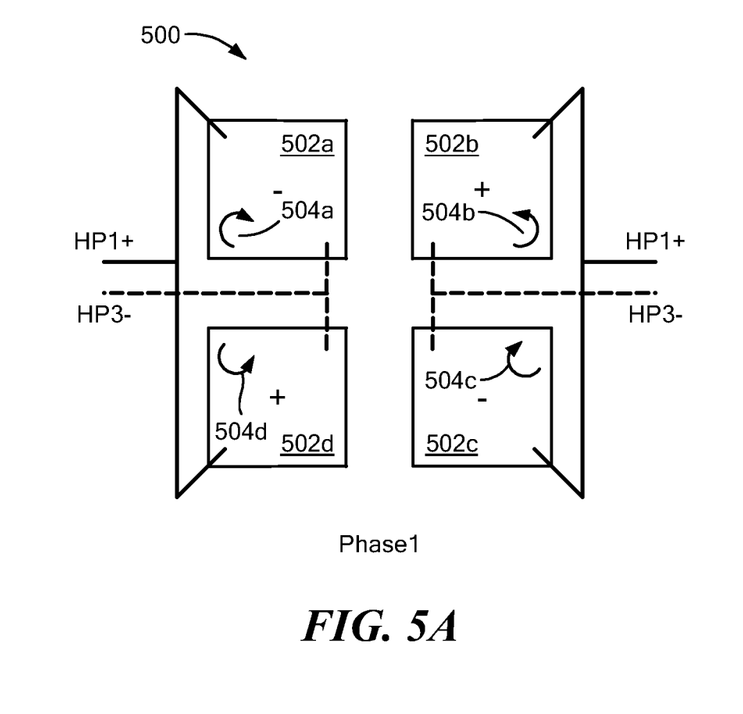
FIG. 5A shows phase 1 and FIG. 5B shows phase 2 configurations for a quad Hall element array with a routing configuration configured to reduce inductive coupling.
Figure 5B:
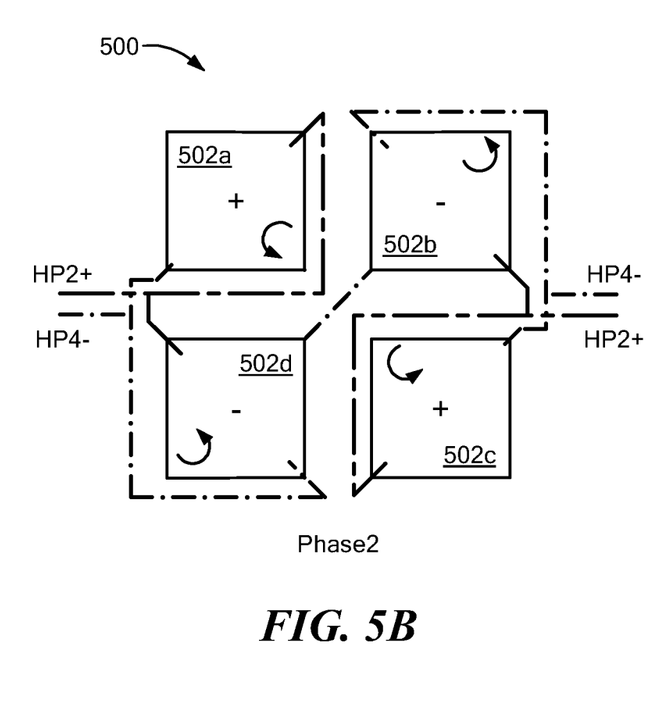

FIGS. 5A and 5B show an embodiment 500 that includes routing to reduce inducting coupling for sensors having Hall elements 502a-d in which at least one other Hall element cancels a field generated by a different Hall element. In the illustrated embodiment, a sensor includes a quad Hall element array having four Hall elements 502a-d. During a first chopping phase, as shown in FIG. 5A, a first (positive) voltage sensing terminal HP1+ is located at respective outer corners of the quad array and a second (negative) voltage sensing terminal HP3– is located at respective inner corners of the quad array. As can be seen, a respective current 504a-d is generated in each of the Hall elements. Each Hall element can be considered a mirror instance of another Hall element in the quad array with an equal and opposite coupling factor. In the first phase, the first and third Hall elements 502a,c may generate a positive current and the second fourth Hall elements 502b 502d may generate a negative current. The first Hall element 502a may generate a current 504a that is cancelled by a current 504d generated by the fourth Hall element 504d, and so on. The generated currents 504a,b,c,d cancel each other in the first phase, i.e., the net inductive coupling is zero.

FIG. 5B shows the terminal arrangement and field cancellation for phase 2 of offset cancellation in which the Hall element voltage sense terminals have shifted 90 degrees from phase 1. As can be seen, the currents generated by magnetic field in to (or out of) the Hall elements 502 is nulled since a net of all the currents is substantially zero. The positive Hall element voltage sense signals are designated HP2+ and the negative Hall element voltage sense signals are designated HP4−.

In the illustrated embodiment, the routing from the Hall sense terminals to the front-end amplifier (not shown) forms a single loop for each Hall plate. Instead of cancelling the inductively coupled signal with a second loop within that Hall plate, inductive cancelling is achieved by an adjacent Hall plate. Traces with the same direction of current flow are placed diagonal of each other to best match other routing parasitic characteristics.

With this arrangement, there may be less routing congestion with fewer metal layers than embodiments described above. To eliminate the need for additional loops, positive (+) and negative (−) signals are routed relatively close together when traversing from left to right of Hall plate array.

In other embodiments, other routing and Hall element terminal configurations can reduce coupling to meet the needs of a particular application. For example, an example quad array may have four positive loops in one spin phase and four negative loops in another phase. With each loop having a matched, but opposite polarity loop, the resulting inductive coupling is cancelled.

Figure 6A:
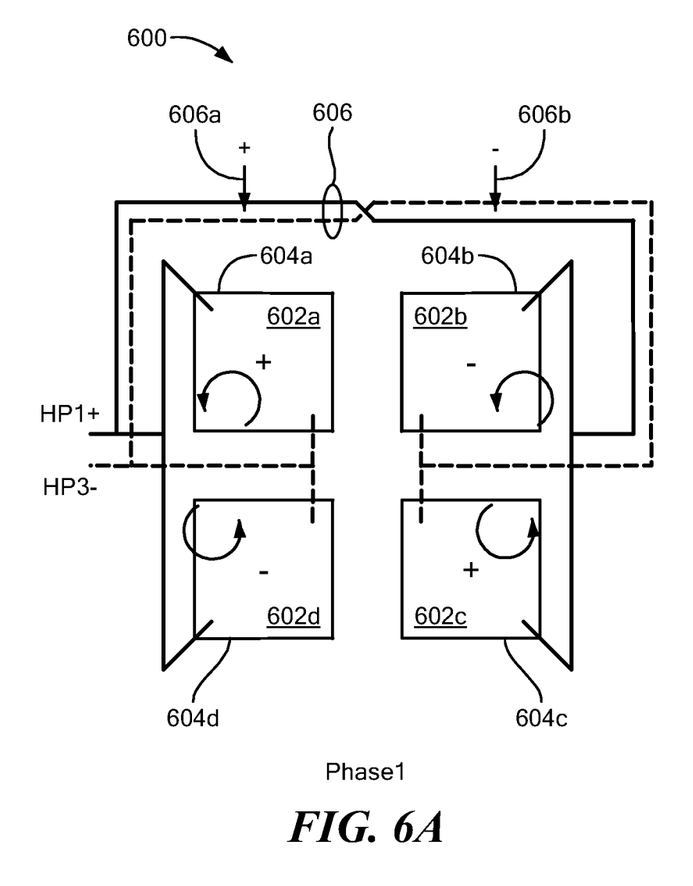
FIG. 6A shows phase 1 and FIG. 6B shows phase 2 configurations for a quad Hall element array with a routing configuration configured to reduce inductive coupling.
Figure 6B:
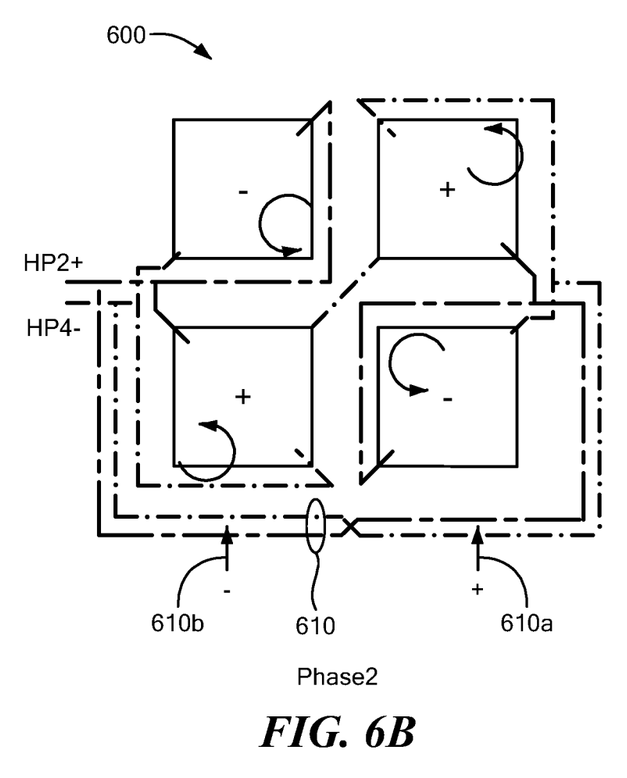

FIGS. 6A and 6B show another embodiment of a sensor having inductive coupling cancellation. To further reduce unwanted inductive signal coupling, relatively long connections can include twisted wire pairs. A balanced, twisted pair ensures that the area between first and second routes in the pair is equal between positive and negative coupling.

In the illustrated embodiment 600, in a first phase (FIG. 6A), quad array elements 602a-d have a connection to HP1+ in outer corners 604a-d of the array and HP3− connections in inner corners of the array. A twisted wire pair 606 includes a first (+) twister wire 606a and a second (−) twisted wire 606b routing around one half, shown as the upper half, of the array. The twisted wires 606a,b make respective connections to the positive Hall element voltage sense terminals (HP1+) and the negative Hall element voltage sense terminals (HP3−).

In a second phase (FIG. 6B), a twisted wire pair 610 can include positive 610a and negative 610b wires routed across a bottom of the quad array. In the illustrated embodiment, the positive wire 610a is coupled to HP2+ and negative connections are coupled to HP4−.

Relatively long signal routes, such as those from the Hall plate array to the front end amplifier, should also include equally represented twists of loops of equal and opposite polarity, such as by rotating the order of the routes.

Figure 7:
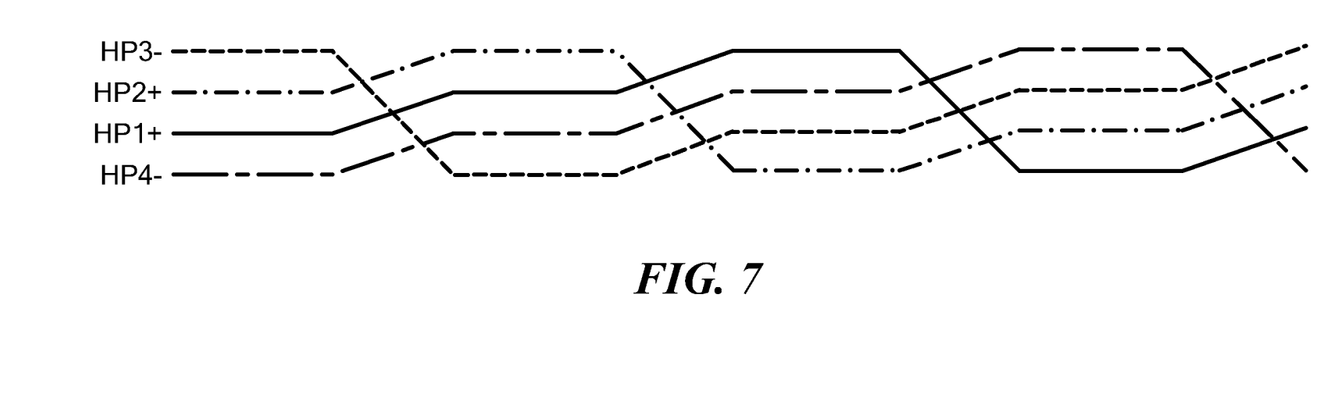
FIG. 7 shows Hall plate signals for twisted pair routing to reduce inductive coupling.

FIG. 7 shows example twisted signals for sets of Hall plates based on coupling polarity. In the illustrated embodiment, the routing is represented as HP1+, HP2+, HP3−, & HP4− (as above) over long distances, i.e. from the hall plates to the front end amplified. HP1+ & HP3− are the positive and negative polarities (respectively) of chopping phase 1. HP2+ & HP4− are the positive and negative polarities (respectively) of chopping phase 2.

Figure 8A:
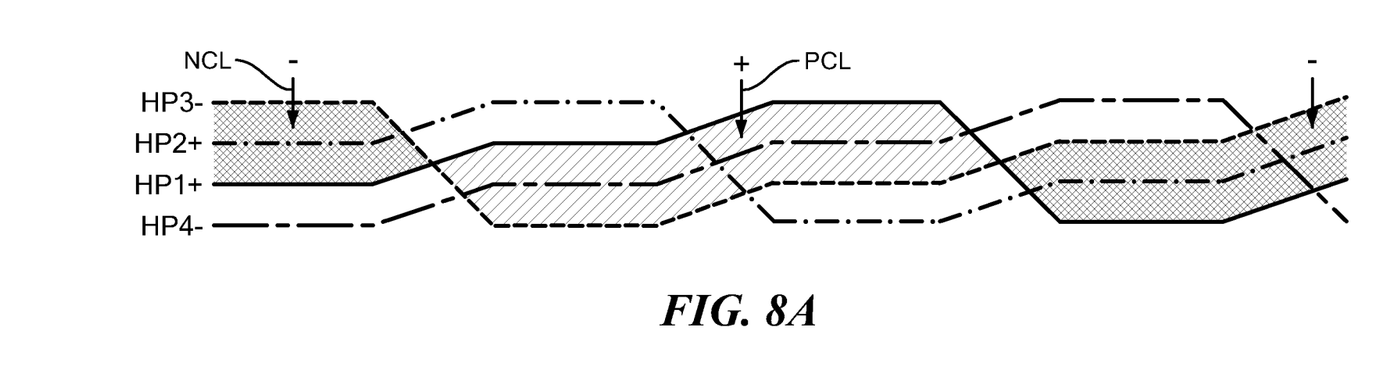
FIGS. 8A and 8B show example loop coupling parity reduce inductive coupling.
Figure 8B:
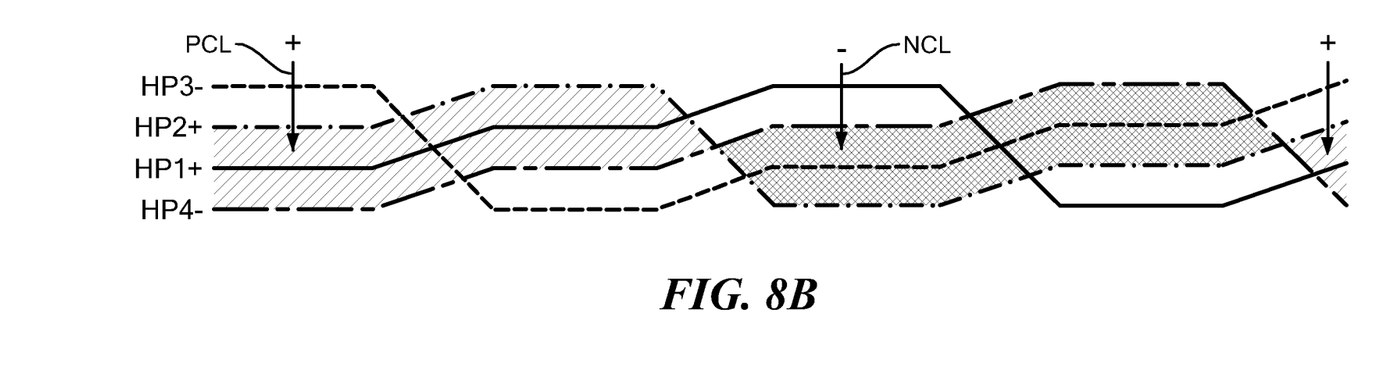

In FIGS. 8A and 8B, routing is represented as HP1+, HP2+, HP3−, & HP4− (as above) where the shaded areas represent the loops formed by the routing. A magnetic field in to (or out of) the page will generate a clockwise (or counter clockwise) current that will result in a positive (or negative) coupling. FIG. 8A represents the loops formed with the routes of chopping phase 1. First shading PCL represents the area of the positive coupling loops and second shading NCL represents the area of the negative coupling loops. The area of the first and second shaded loops PCL, NCL is equal for equal and opposite coupling factor cancellation. Similarly, FIG. 8B shows the positive and negative loops PCL, NCL formed by chopping phase 2.

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Example magnetic field sensors can have a variety of features that may be described in one or more of the following patents or patent publications: U.S. Pat. Nos. 6,525,531, 6,278,269, 5,781,005, 7,777,607, 8,450,996, 7,772,838, 7,253,614, 7,026,808, 8,624,588, 7,368,904, 6,693,419, 8,729,892, 5,917,320, 6,091,239, 2012/0249126, all of which are herein incorporated herein by reference.

Any processing described herein may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A device, comprising:
    a Hall element having a first pair of first and second voltage sensing terminals, wherein the first and second voltage sensing terminals are located at diametrically opposed locations on the Hall element, and a second pair of third and fourth voltage sensing terminals, wherein the third and fourth voltage sensing terminals are located at diametrically opposed locations on the Hall element; and
    a first mirror conductive path extending around a perimeter of the Hall element in a first direction to the first voltage sensing terminal in the first pair of voltage sensing terminals and a second mirror conductive path extending around the perimeter of the Hall element in a second direction to the first voltage sensing terminal so that the first and second mirror conductive paths are on opposite sides of the Hall element and are equal and opposite to cancel inductive coupling.

2. The device according to claim 1, further including an array of Hall elements having routing to cancel inductive coupling.

3. The device according to claim 2, further including at least one twisted wire pair comprising a first wire connected to at least positive voltage sensing terminals in the array and a second wire connected to at least one negative voltage sensing terminals in the array.

4. The device according to claim 1, further including an array of Hall elements having routing to cancel inductive coupling during a first phase comprising first voltage sensing locations on the respective Hall elements and a second phase comprising second voltage sensing locations on the Hall elements shifted from the first phase sensing locations.

5. The device according to claim 4, wherein first and second phases form part a signal chopping process.

6. The device according to claim 4, wherein the first and second voltage sensing locations are shifted ninety degrees from the first phase to the second phase.

7. The device according to claim 4, wherein the array of Hall elements comprises four Hall elements.

8. The device according to claim 7, wherein two of the Hall elements are configured to cancel inductive effects of the other two Hall elements.

9. A method, comprising:
    in a magnetic field sensing device, employing a Hall element having a first pair of first and second voltage sensing terminals, wherein the first and second voltage sensing terminals are located at diametrically opposed locations on the Hall element, and a second pair of third and fourth voltage sensing terminals, wherein the third and fourth voltage sensing terminals are located at diametrically opposed locations on the Hall element; and
    employing a first mirror conductive path extending around a perimeter of the Hall element in a first direction to the first voltage sensing terminal in the first pair of voltage sensing terminals and a second mirror conductive path extending around the perimeter of the Hall element in a second direction to the first voltage sensing terminal so that the first and second mirror conductive paths are on opposite sides of the Hall element and are equal and opposite to cancel inductive coupling.

10. The method according to claim 9, further including employing an array of Hall elements having routing to cancel inductive coupling.

11. The method according to claim 10, further including employing at least one twisted wire pair comprising a first wire connected to at least one positive voltage sensing terminals in the array and a second wire connected to at least one negative voltage sensing terminals in the array.

12. The method according to claim 9, further including employing an array of Hall elements having routing to cancel inductive coupling during a first phase comprising first voltage sensing locations on the respective Hall elements and a second phase comprising second voltage sensing locations on the Hall elements shifted from the first phase sensing locations.

13. The method according to claim 12, wherein first and second phases form part a signal chopping process.

14. The method according to claim 12, wherein the first and second voltage sensing locations are shifted ninety degrees from the first phase to the second phase.

15. The method according to claim 12, wherein the array of Hall elements comprises four Hall elements.

16. The method according to claim 15, wherein two of the Hall elements are configured to cancel inductive effects of the other two Hall elements.

17. A device, comprising:
an array of Hall elements each of the Hall elements having a first pair of first and second voltage sensing terminals, wherein the first and second voltage sensing terminals are located at diametrically opposed locations on the Hall elements, and a second pair of third and fourth voltage sensing terminals, wherein the third and fourth voltage sensing terminals are located at diametrically opposed locations on each of the Hall elements; and
routing connections comprising a first path from the first voltage sensing terminal of first and second ones of the Hall elements and a second path from the second voltage sensing terminals of the first and second ones of the Hall elements, wherein the first and second paths are configured to mutually cancel fields generated in the first and second ones of the Hall elements.

18. The device according to claim 17, wherein the array of Hall elements comprises four Hall elements.

19. The device according to claim 17, wherein the first and second paths are connected during a first phase and not connected during a second phase.

20. The device according to claim 17, wherein the routing connections further comprise, during the second phase, a third path from the third voltage sensing terminal of first and second ones of the Hall elements and a fourth path from the second voltage sensing terminals of the first and second ones of the Hall elements, wherein the third and fourth paths are configured to mutually cancel fields generated in the first and second ones of the Hall elements.

21. The device according to claim 17, further including a first connection comprising at least one twisted wire pair comprising a first wire connected to at least one positive voltage sensing terminals in the array and a second wire connected to at least one negative voltage sensing terminals in the array.

22. The device according to claim 21, wherein the first connection is present during a first phase of a chopping process.

23. The device according to claim 22, further including a second connection comprising at least one twisted wire pair comprising a third wire connected to at least one of the positive voltage sensing terminals in the array and a fourth wire connected to at least one of the negative voltage sensing terminals in the array.

24. The device according to claim 23, wherein the second connection is present during a second phase of the chopping process.

25. A method, comprising:
in a magnetic field sensing device, employing an array of Hall elements each of the Hall elements having a first pair of first and second voltage sensing terminals, wherein the first and second voltage sensing terminals are located at diametrically opposed locations on the Hall elements, and a second pair of third and fourth voltage sensing terminals, wherein the third and fourth voltage sensing terminals are located at diametrically opposed locations on each of the Hall elements; and
employing routing connections comprising a first path from the first voltage sensing terminal of first and second ones of the Hall elements and a second path from the second voltage sensing terminals of the first and second ones of the Hall elements, wherein the first and second paths are configured to mutually cancel fields generated in the first and second ones of the Hall elements.

26. The method according to claim 25, wherein the array of Hall elements comprises four Hall elements.

27. The method according to claim 25, wherein the first and second paths are connected during a first phase and not connected during a second phase.

28. The method according to claim 27, wherein the routing connections further comprise, during the second phase, a third path from the third voltage sensing terminal of first and second ones of the Hall elements and a fourth path from the second voltage sensing terminals of the first and second ones of the Hall elements, wherein the third and fourth paths are configured to mutually cancel fields generated in the first and second ones of the Hall elements.

29. The method according to claim 25, further including a first connection comprising at least one twisted wire pair comprising a first wire connected to at least one positive voltage sensing terminals in the array and a second wire connected to at least one negative voltage sensing terminals in the array.

30. The method according to claim 29, wherein the first connection is present during a first phase of a chopping process.

31. The method according to claim 30, further including a second connection comprising at least one twisted wire pair comprising a third wire connected to at least one of the positive voltage sensing terminals and a fourth wire connected to at least one of the negative voltage sensing terminals.

32. The method according to claim 31, wherein the second connection is present during a second phase of the chopping process.

* * * * *

UNITED STATES PATENT AND TRADEMARK OFFICE
CERTIFICATE OF CORRECTION

PATENT NO. : 12,140,646 B2
APPLICATION NO. : 18/164676
DATED : November 12, 2024
INVENTOR(S) : Tyler Daigle et al.

Page 1 of 1

It is certified that error appears in the above-identified patent and that said Letters Patent is hereby corrected as shown below:

In the Specification

Column 9, Line 18, delete "are herein incorporated" and replace with --are incorporated--.

In the Claims

Column 10, Line 26, Claim 3, delete "least positive" and replace with --least one positive--.

Column 10, Line 36, Claim 5, delete "part a" and replace with --part of a--.

Column 11, Line 14, Claim 13, delete "part a" and replace with --part of a--.

Signed and Sealed this
Third Day of June, 2025

Coke Morgan Stewart
*Acting Director of the United States Patent and Trademark Office*